United States Patent
Dames et al.

(10) Patent No.: US 9,684,016 B2
(45) Date of Patent: Jun. 20, 2017

(54) SENSORS

(75) Inventors: Andrew Nicholas Dames, Cambridge (GB); Matthew Emmanuel Storkey, Cambridge (GB); Hilary Meanwell, Essex (GB); Edward Colby, Cambridge (GB)

(73) Assignee: Sentec Ltd., Cambridge (GB)

( * ) Notice: Subject to any disclaimer, the term of this patent is extended or adjusted under 35 U.S.C. 154(b) by 675 days.

(21) Appl. No.: 14/126,322

(22) PCT Filed: Jun. 27, 2012

(86) PCT No.: PCT/GB2012/051508
§ 371 (c)(1),
(2), (4) Date: Dec. 13, 2013

(87) PCT Pub. No.: WO2013/001298
PCT Pub. Date: Jan. 3, 2013

(65) Prior Publication Data
US 2014/0125321 A1 May 8, 2014

(30) Foreign Application Priority Data

Jun. 27, 2011 (GB) .................................. 1110825.5

(51) Int. Cl.
*G01R 15/18* (2006.01)
(52) U.S. Cl.
CPC ......... *G01R 15/181* (2013.01); *G01R 15/186* (2013.01)
(58) Field of Classification Search
CPC ...... G01R 33/04; G01R 15/181; G01R 33/18; G01R 33/3607; H01L 23/5227; H01L 2924/3011; H01L 21/324; G01L 3/103

USPC .. 324/724, 600, 452–453, 500, 514, 754.04, 324/200, 127, 244; 361/763, 772, 777, 361/813; 257/676, 692, 725, E21.494
See application file for complete search history.

(56) References Cited

U.S. PATENT DOCUMENTS 5,521,572 A 5/1996 Goodwin
5,617,019 A 4/1997 Etter
(Continued)

FOREIGN PATENT DOCUMENTS

CN 1379860 A 11/2002
EP 1467213 A2 10/2004
(Continued)

OTHER PUBLICATIONS

Great Britain Search Report and Written Opinion for Application No. GB1110825.5, Filing Date Jun. 27, 2011, Date of Search Oct. 13, 2011, Mailed Oct. 14, 2011, 1 pg.
(Continued)

*Primary Examiner* — Melissa Koval
*Assistant Examiner* — Trung Nguyen
(74) *Attorney, Agent, or Firm* — KPPB LLP

(57) ABSTRACT

A current sensor comprises a first component comprising plural coils. Each coil comprises one or more turns printed on at least one planar surface of a respective substrate, and the planes of the coils are parallel to one another and are perpendicular to a longitudinal axis of the first component. A second component comprises soft magnetic material and has first and second planar faces that are at opposite ends of the first component and are arranged perpendicularly to and are intersected by the longitudinal axis of the first component.

20 Claims, 13 Drawing Sheets

(56) References Cited

U.S. PATENT DOCUMENTS

| | | | |
|---|---|---|---|
| 6,118,271 A * | 9/2000 | Ely | G01D 5/2046 324/207.17 |
| 6,313,727 B1 | 11/2001 | Gabriel | |
| 6,414,475 B1 | 7/2002 | Dames et al. | |
| 7,642,768 B1 | 1/2010 | Kinzel | |
| 2003/0112000 A1 | 6/2003 | Sorenson, Jr. | |
| 2004/0183522 A1 | 9/2004 | Gunn | |
| 2004/0257061 A1 | 12/2004 | George de Buda | |
| 2006/0097713 A1 | 5/2006 | Brandt | |
| 2006/0131965 A1* | 6/2006 | Friedland | G02B 26/105 310/12.22 |
| 2009/0322326 A1 | 12/2009 | Ito et al. | |

FOREIGN PATENT DOCUMENTS

| | | |
|---|---|---|
| JP | 2010048755 A | 3/2010 |
| JP | 2010060546 A | 3/2010 |
| WO | 2011018530 A1 | 2/2011 |
| WO | 2011018533 A1 | 2/2011 |

OTHER PUBLICATIONS

International Search Report and Written Opinion for International Application No. PCT/GB2012/051508, International Filing Date Jun. 27, 2012, Search Completed Sep. 21, 2012, Mailed Oct. 1, 2012, 11 pgs.

* cited by examiner

SENSORS

This invention relates to sensors.

Current sensors are well known. A current sensor can be used for measurement of current in a conductor through which the current flowing is so high that the direct application of measuring instruments is undesirable or impossible.

One well known form of current sensor is a Rogowski coil. These typically comprise a toroid of wire wound around a non-magnetic core that encircles the conductor of interest. A correctly formed Rogowski coil, with equally spaced windings and a regular shape, is quite insensitive to external magnetic fields whilst being sensitive to magnetic fields generated by the encircled conductor. However, it can be difficult to achieve correctly formed Rogowski coils, especially if they are required to be configured such that they can be retrofitted around a conductor of interest.

A number of sensors based on the Rogowski principle but absent of toroidal coils have been proposed. U.S. Pat. No. 5,521,572 discloses a sensor that is included within an electricity meter and includes material to define two air gaps in which secondary coils are located. U.S. Pat. No. 6,313,727 discloses a sensor that is retrofittable onto a three phase system and includes helical sensing coils with low coercivity bars. U.S. Pat. No. 5,617,019 discloses a sensor that is designed to fit a busbar and is not retrofittable. Most of the embodiments incorporate shielding, to improve rejection of external fields. All three disclose magnetic circuits with a sensing coil in an air gap between two soft magnetic components.

Sentec Limited has produced a number of different sensors based on the principle of the Rogowski sensor but using coils printed onto circuit boards, which simplifies manufacture and improves accuracy of manufactured product. Examples include U.S. Pat. No. 6,414,475 and WO 2011/018530. An example of an easily retrofittable sensor incorporating coils printed onto circuit boards is WO 2011/018533.

Sensor design incorporates many considerations, including ease and cost of manufacture, sensitivity to external fields, uniformity of sensitivity within a sensing zone and physical dimensions. Some of the sensors with the best performance are too large to be accommodated easily in some environments, an example of which is an electricity substation in which conductors of interest are closely packed together within a cabinet or other container.

The invention was made in this context.

According to a first aspect of the invention there is provided a sensor comprising:
 a first component comprising plural coils, wherein:
  each coil comprises one or more turns printed on at least one planar surface of a respective substrate, and
  the planes of the coils are parallel to one another and are perpendicular to a longitudinal axis of the first component; and
 a second component comprising soft magnetic material and having first and second planar faces that are at opposite ends of the first component and are arranged perpendicularly to and are intersected by the longitudinal axis of the first component.

The second component may comprise only soft magnetic material or it may include other components. In some embodiments, the second component comprises one or more other components including coils. In the embodiments, the components including coils are absent of magnetic material.

A separation between adjacent coils may be approximately the same for all coils of the first component. The separation may be exactly the same. Separations may instead vary, at a cost of reduced performance.

The coils of the first component may each include the same number of turns and have the same area on the substrate. They may instead be different and indeed this may be preferred if the regular coil separation cannot be achieved.

The second component may comprise a U-shaped soft magnetic component and the first and second faces may be parallel faces within the mouth of the U. Here, the second component may be separable from the first component so as to allow a conductor to be introduced into the U before the second component is placed within the mouth of the U of the second component. Alternatively or in addition, a separation between adjacent coils may approximately the same for all coils of the first component and a separation between a coil closest to the first end and the first contact face may be substantially equal to a separation between a coil closest to the second end and the second contact face and may be equal or approximately equal to half of the separation between adjacent coils.

Although providing an optimal arrangement, irregular spacing may instead be provided, in which case the effects of irregular spacing can be mitigated by varying the turn area product on appropriate ones of the substrates.

The sensor may comprise means for causing the second component to be maintained within the mouth of the U of the second component.

The second component may also include a third component comprising plural coils, wherein: each coil of the third component comprises one or more turns printed on at least one planar surface of a respective substrate, and the coils of the third component are parallel to one another and lie on a longitudinal axis of the third component; and wherein the second component comprises third and fourth planar faces that are arranged perpendicularly to and are intersected by the longitudinal axis of the third component.

Here, the second component may comprise first and second I-shaped components, the first I-shaped component including the first and third faces and the second I-shaped component including the second and fourth faces.

A separation between adjacent coils may be approximately the same for all coils of the first and third components and wherein a separation between a coil closest to the first end of the first component and the first face is the same as a separation between a coil closest to the second end of the first component and the second face, which is the same as a separation between a coil closest to the first end of the third component and the third face and is the same as a separation between a coil closest to the second end of the third component and the fourth face, and is approximately half the separation between adjacent coils.

Although providing an optimal arrangement, irregular spacing may instead be provided, in which case the effects of irregular spacing can be mitigated by varying the turn area product on appropriate ones of the substrates.

The second component may comprise one or more further components each including plural coils, wherein: each coil of each further component comprises one or more turns printed on at least one planar surface of a respective substrate, and the coils of each further component are parallel to one another and lie on a longitudinal axis of the further component.

Adjacent substrates may be mechanically separated by spacers.

An end substrate in the first component may be separated from the first component by a spacer.

The sensor may comprise a circuit board configured to connect the coils in a circuit.

The sensor may comprise one or more shielding components configured to at least partially surround the first component and, if present, the third component.

The sensor may comprise a current-carrying conductor extending through a central portion of the sensor.

The soft magnetic material may be a ferrite.

Each coil may comprise one or more turns printed on at least two parallel surfaces of a respective substrate.

The first component may comprise first and second coils printed respectively on first and second parallel surfaces of a first substrate. Here, the second component may also include a third component comprising third and fourth coils printed on first and second parallel surfaces of a second substrate respectively, wherein the coils of the third component are parallel to one another and lie on a longitudinal axis of the third component; and wherein the second component comprises third and fourth planar faces that are arranged perpendicularly to and are intersected by the longitudinal axis of the third component. The first and second substrates may be of the same thickness and a separation the third coil and the fourth component may be the same as a separation between the first coil and the second component.

The first and third components may be formed of a single multilayer printed circuit board having formed therein a slot or cutaway configured to receive a conductor.

The sensor may contain an insulating and/or weatherproof housing.

Embodiments of the invention will now be described, by way of example, with reference to the accompanying drawings in which.

A sensor 10 according to a first embodiment of the invention will now be described with reference to FIGS. 1 to 5.

Figure 1:
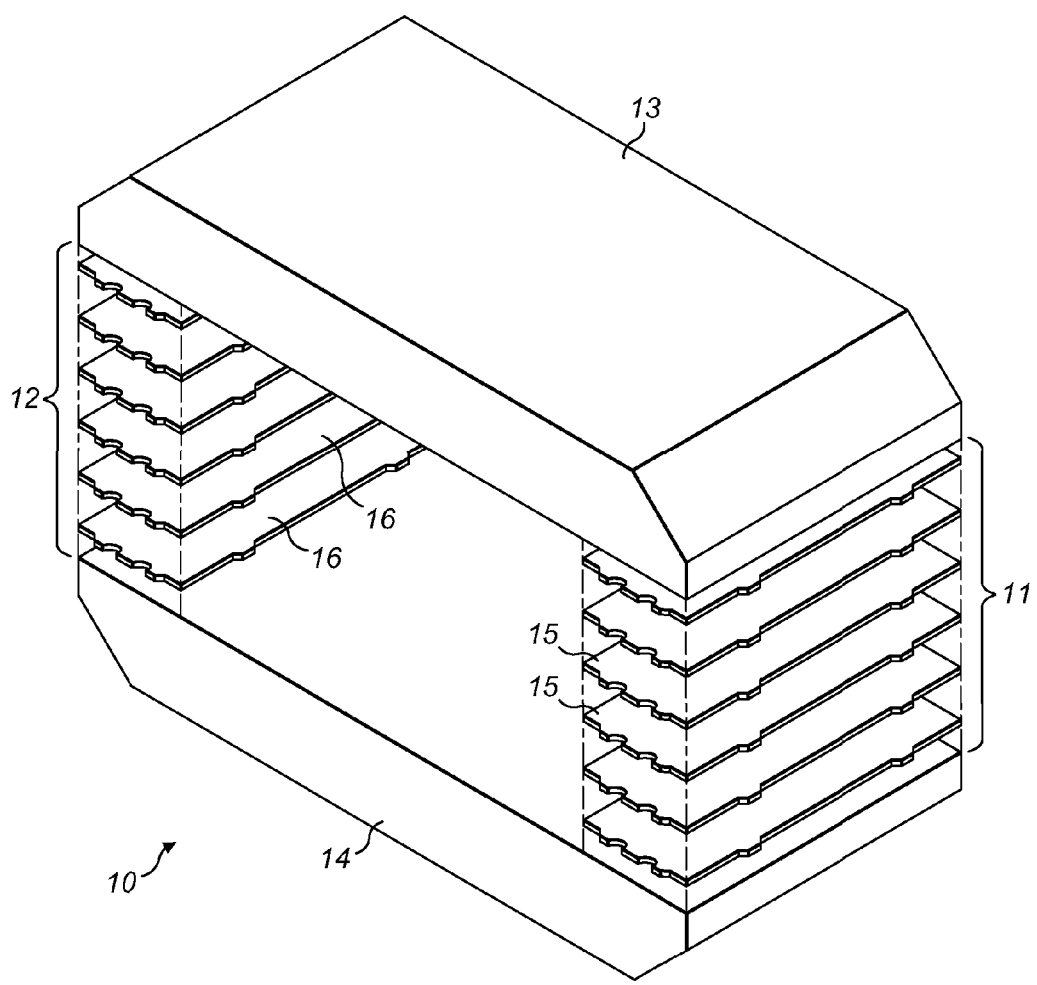
FIG. 1 is a perspective view of a first embodiment of a sensor according to the invention.

As can best be seen in FIG. 1, a sensor 10 includes first and second components 11, 12, each including plural coils, and third and fourth components 13, 14, each comprising soft magnetic material. The first and second components 11, 12 will hereafter be termed coil stacks. The third and fourth components 13, 14, will hereafter be referred to as soft magnetic bars or just magnetic bars. The magnetic bars are formed of a material with low coercivity. Iron is a suitable material, although other materials also are suitable. The material may be a ferrite. The material may be for instance an alloy of Nickel. The material may for instance be laminated electrical steel. Here, the laminates preferably lie in the plane perpendicular to the axis of the conductor that is the subject of measurement, e.g. the plane of FIG. 2b.

Each of the coil stacks 11, 12 includes a number of circuit boards 15, each of which has printed thereon a number of coils, and a number of spacers 16 in between the circuit boards.

Figure 2A:
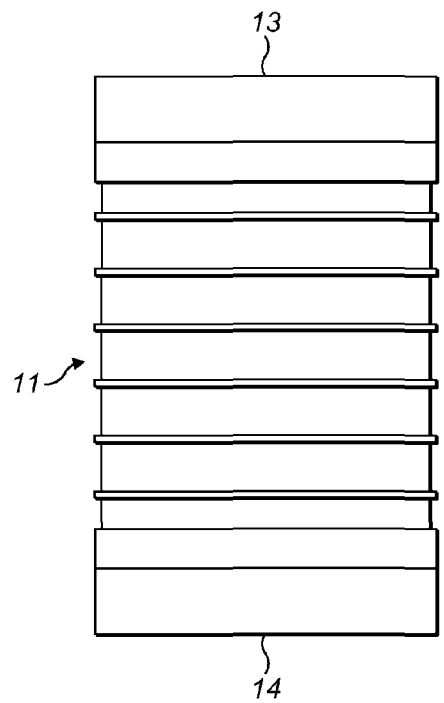
FIG. 2 are side and end views of the first embodied sensor.
Figure 2B:
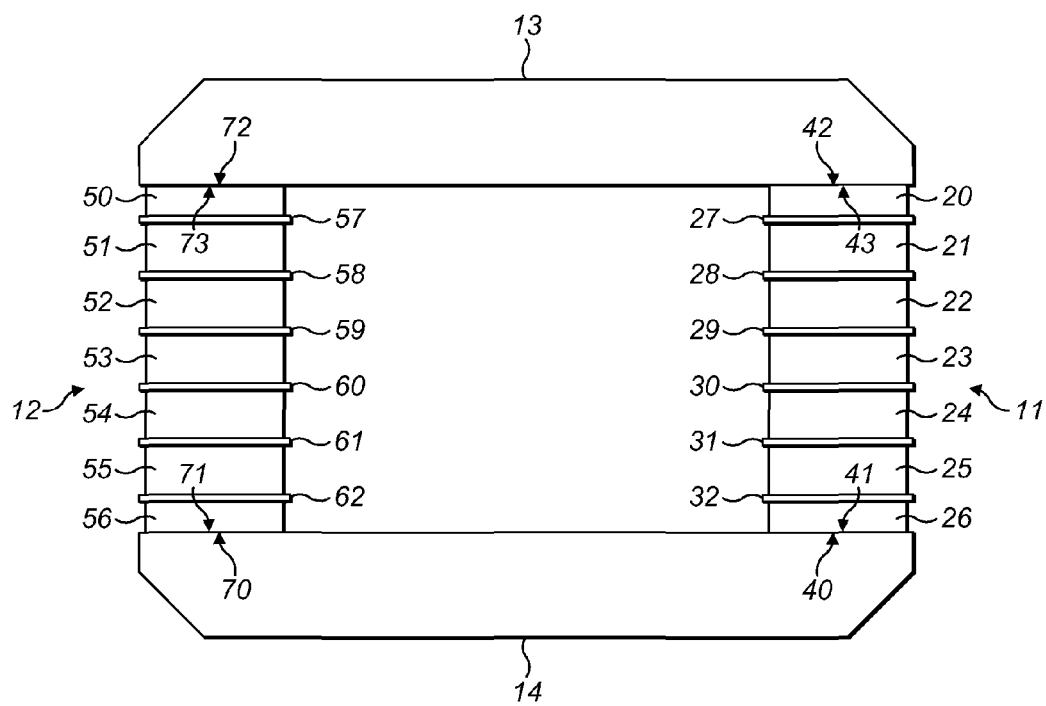

As can be seen best from FIGS. 2a and 2b, the first coil stack 11 includes first to sixth circuit boards 27 to 32 and first to seventh spacers 20 to 26. The second spacer 21 is located between the first and second circuit boards 27, 28, and so on. The first spacer 20 is located at the uppermost end of the first coil stack 11 and its lowermost face abuts the uppermost surface of the first circuit board 27. The sixth spacer 26 is located at the lowermost end of the coil stack 11 and it's uppermost face abuts the lowermost face of the circuit board 32. An end or lowermost face 31 of the sixth spacer 26 is parallel to an end or uppermost face 43 of the first spacer 20 and is perpendicular to a longitudinal axis of the first coil stack 11.

In this embodiment, the circuit boards 27 to 32 are relatively thin and the spacers 20 to 26 are relatively thick compared to the circuit boards. Each of the circuit boards 27 to 32 is substantially rectangular in shape. Each is the same size as all of the other circuit boards of the first coil stack 11. Each of the spacers 20 to 26 also is rectangular. The spacers 20 to 26 are the same as one another except that the first and sixth spacers 20, 26 are thinner than the second to fifth spacers 21 to 25, as is described in more detail below. The dimensions of the spacers 20 to 26 apart from the thicknesses of the spacers are approximately the same as the dimensions of the circuit boards 27 to 32. Moreover, the spacers 20 to 26 and the circuit boards 27 to 32 are coupled to one another, for instance by gluing. Coupling is provided whilst the spacer is 20 to 26 and the circuit boards 27 to 32 are in alignment, so the overall shape of the first coil stack 11 is of a rectangular cuboid. Because the second to fifth spacers 21 to 25 each have the same thickness, the separation between adjacent ones of the first to fifth circuit boards 27 to 32 is the same.

The key function of the spacers 20 to 26 is to maintain the printed circuit boards 27 to 32 at the desired separation and as such the spacers may instead take some other form without compromising the sensor 10.

Figure 3:
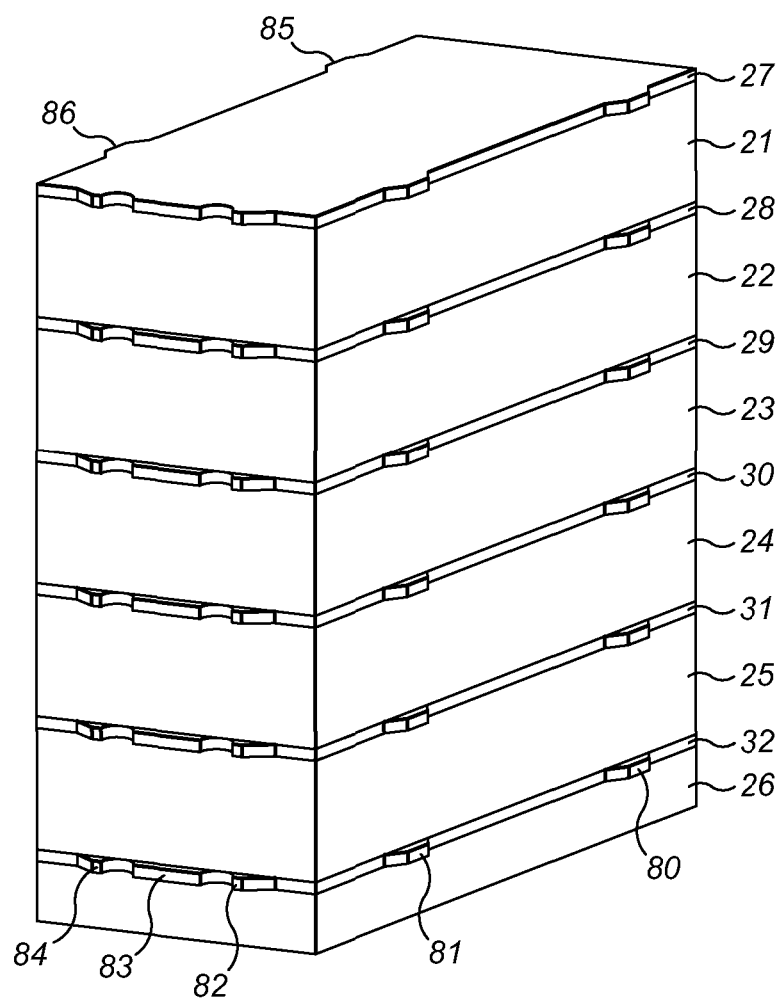
FIG. 3 is a perspective view of part of a coil stack forming part of the first embodied sensor.

FIG. 3 is an alternative view of the first coil stack 11. Here, the first spacer 20 is omitted from the Figure, allowing the uppermost surface of the first circuit board 27 to be visible.

As can be seen most clearly in FIG. 3, each of the circuit boards 27 to 32 is provided with a number of tabs at three of its edges. In particular, on the edge that is externally facing (leftwards in FIG. 2b), first and second tabs 80 and 81 are provided approximately one quarter and three quarters of the distance along the edge of the circuit board. Tabs 85, 86 are provided at corresponding locations on the opposite side of each circuit board 27 to 32. On the edge of the circuit boards 27 to 32 that are viewed face on in FIG. 2b, are three tabs, referenced as 82, 83 and 84. The tab 83 is formed approximately centrally along the edge of the circuit board and the tabs 82 and 84 are located on either side. Between the central tab 83 and each of the tabs 82 and 84 are formed recesses.

The purpose of the tabs 82 to 86 is described in more detail below.

Referring again to FIGS. 1 and 2, it will be seen that the second coil stack 12 is identical in form to the first coil stack 11. The second coil stack 12 includes first to sixth circuit boards 57 to 62 and first to seventh spacers 50 to 56, corresponding to the circuit boards 27 to 32 in the spacers 20 to 26 of the first stack 11 respectively.

At the lowermost end of the second coil stack 12 is a face 71 that is parallel to a face 73 at the uppermost end of the second coil stack 12. Both faces are perpendicular to a longitudinal axis of the second coil stack 12

The first and second coil stacks 11, 12 are aligned so that the uppermost faces 43, 73 of the first and second coil stack respectively are formed in a common plane. Similarly, the lowermost faces, 41, 71 of the first and second coil stacks 11, 12 respectively are also in a common plane.

The first and second magnetic bars 13, 14 each generally have the form of a rectangular cuboid. However, each of the soft magnetic bars 13, 14 is bevelled along two edges thereof.

On one face of the first soft magnetic bar 13, which is facing downwards in FIG. 2, is a face 42 that abuts the uppermost end face of 43 the first coil stack 11. It also includes a face 72 that abuts the uppermost end face 73 of the second coil stack 12.

Similarly, the second soft magnetic bar 14 has on the face that is facing uppermost in FIG. 2 a face 40 that abuts the lowermost end face 41 of the first coil stack and a face 70 that abuts the lowermost face 71 of the second coil stack 12.

The cuboid shape of each bar 13, 14 has three dimensions. A height dimension extends in the same direction as the longitudinal axes of the coil stacks 11, 12. Ends of the length dimension of the magnetic bars 13, 14 are substantially aligned with the cross section of the coil stacks 11, 12. The width dimension of the magnetic bars 13, 14 is generally the same as the corresponding dimension of the coil stacks 11, 12. As such, the soft magnetic bars 13, 14 and the coil stacks 11, 12 together provide a generally rectangular annulus.

The bevelling of the first and second soft magnetic bars 13, 14 is provided at the ends of the bars but on the opposite side to the face of the bar that contacts the first and second coil stacks 11, 12. This provides some rounding-off of the rectangular annulus shape without reducing the maximum current before saturation of the magnetic bars 13, 14.

Because the spacers 20 to 26 of the first coil stack 11 are of uniform thickness, the circuit boards 27 to 32 lie on a common straight axis. Moreover, because the first and second spacers 20 to 26 are of uniform thickness, the lengthwise axes and the faces 42, 72 of the magnetic bars 13, 14 are formed at right angles to the longitudinal axis of the first coil stack 11 and parallel to the planes of the circuit boards 27 to 32.

The same applies to the second coil stack 12 and the second magnetic bar 14, by virtue of the arrangements of the spacers 50 to 56 and the resulting arrangement of the circuit boards 57 to 62.

The first magnetic bar 13 is operable to concentrate magnetic field present at the uppermost end of the first coil stack 11 and to link it directly to the uppermost face 73 of the second coil stack 12. Similarly, the second soft magnetic bar 14 concentrates on magnetic fields between the lowermost end 41 of the first coil stack 11 and lowermost end 71 of the second coil stack 12.

Because the faces 40, 42, 70 72 of the first and second soft magnetic bars 13, 14 are perpendicular to the longitudinal axes of the first and second coil stacks 11, 12, and the end gaps are half the intermediate gaps, (or equal in the case of a single, double-sided board) the sensor 10 can be considered to be equivalent to an infinite solenoid. This is discussed in more detail below.

Each printed circuit board 27 to 32 has formed thereon a coil having plural turns.

Figure 4A:
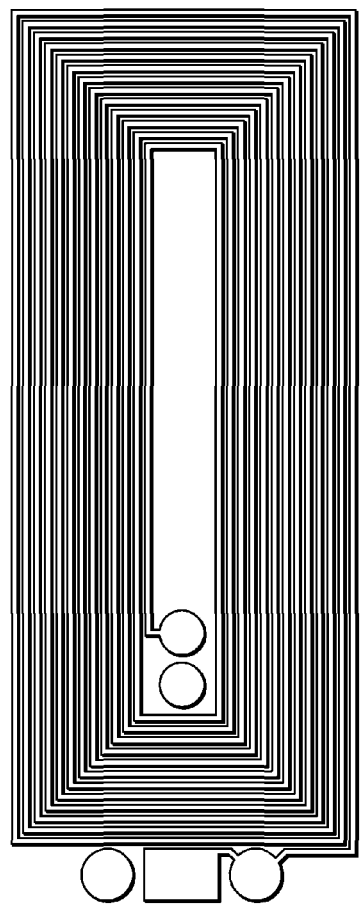
FIGS. 4a and 4b are views of different sides of a printed circuit board forming part of the first embodied sensor.
Figure 4B:
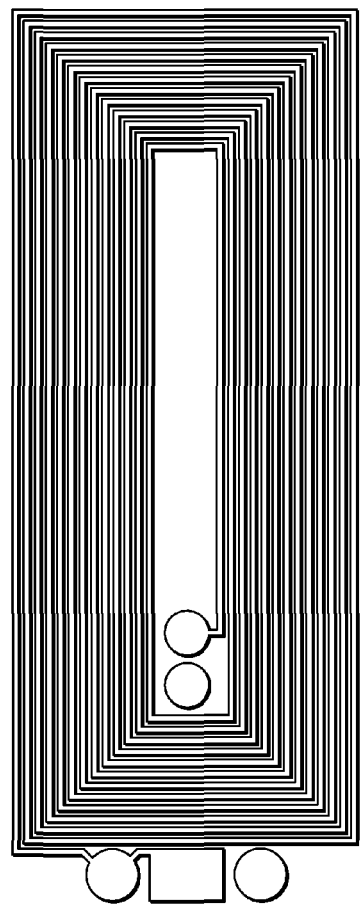

FIG. 4 illustrates surface patternisation on the printed circuit boards 27 to 32 and 57 to 62. On one surface thereof, the pattern shown in FIG. 4a is provided. It will be seen that this comprises plural turns 87 of a coil 88 between innermost and outermost ends. On the other side of the printed circuit board 27 to 32 and 57 to 62, shown in FIG. 4b, plural turns 87 of the coil 88 extend between innermost and outermost ends. Although the direction of the coil 88 appears to be different sides to the printed circuit board, because FIGS. 4a and 4b in different views, the turns are actually in the same direction. Thus, the turns on each side of the printed circuit board are constructive with one another.

A via through the printed circuit board 27 to 32 and 57 to 62 connects the innermost end of the patternisation on each side. As such, a single coil 88 is formed between the outermost end on one side of the printed circuit board 27 to 32 and 57 to 62 and the uppermost end of the other side of the printed circuit board. The number of turns of the coil 88 is equal to the sum of the number of turns on each side of the printed circuit board 27 to 32 and 57 to 62.

In this example, the turns 87 are generally rectangular in shape. This allows the turns 87 to have a large diameter having regard to the size of the printed circuit board 27 to 32.

The printed circuit boards 27 to 32 and 57 to 62 may be made of FR4, for instance.

The coils of the two coil stacks 11, 12 are connected in opposite directions, i.e. clockwise in one and anti-clockwise in the other direction when viewed from above. As such, they are connected in the same direction in the sense of a circuit comprising the coils and the magnetic bars 1, 14.

Figure 5:
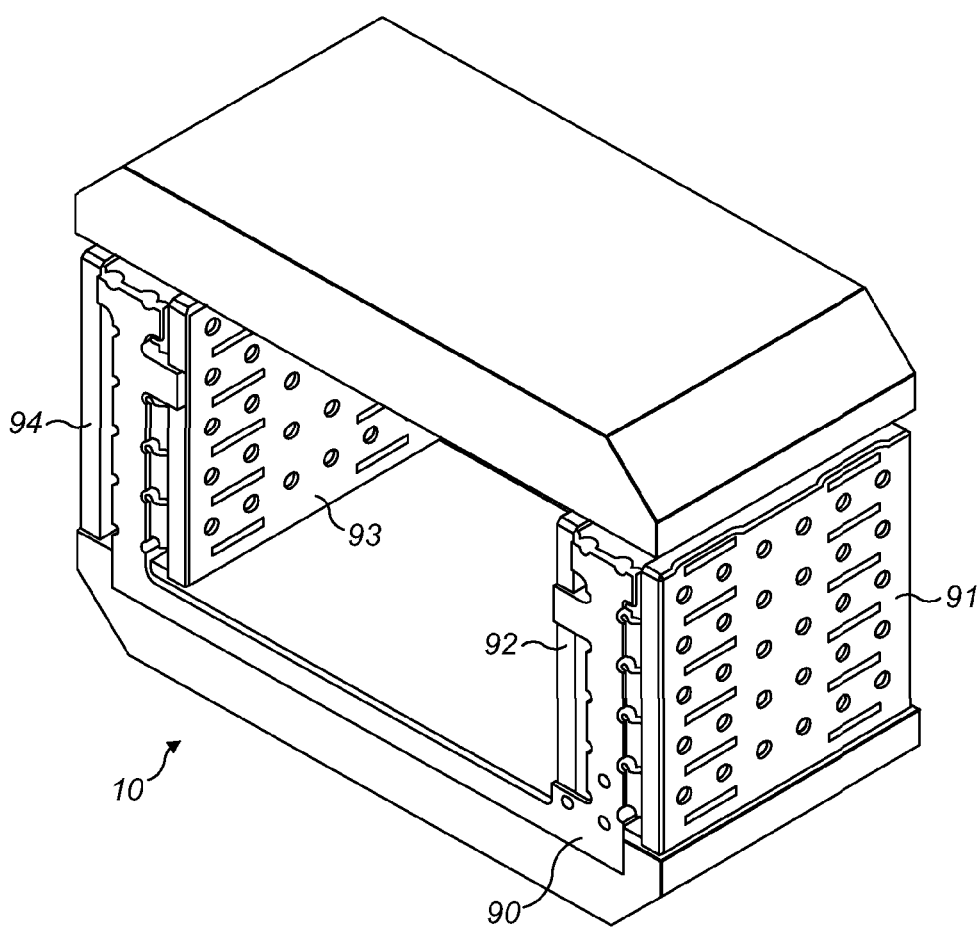
FIG. 5 is a perspective view of the first embodied sensor with a connecting printed circuit board and shielding cans in place.

The coils of the printed circuit board 27 to 32 to 57 to 62 are connected together in series by a circuit provided on a further circuit board 90, which is best seen in FIG. 5. The circuit board 90 is a thin, flexible board.

Also shown in FIG. 5 are first to fourth shielding cans 91 to 94. These comprise perforated metallic plates. Each shielding can 91 to 94 includes slots that are configured to receive the tabs 80, 81, 85 and 86 provided on the printed circuit boards 27 to 32 and 57 to 62. The slots in the shielding cans 91 to 94 engage with the tabs 80, 81, 85 and 86 and result in the shielding cans 91 to 94 being secured to the coil stacks 11, 12.

The shielding cans 91 to 94 each shield the whole of one major face of one of the coil stacks 11, 12. Front and back faces of the coil stacks 11, 12 are not shielded in this embodiment.

An effect of the shielding cans 91 to 94 is to remove electrostatic coupling both from within and from without the sensing volume. If relatively thick conductive material, e.g. 0.3 mm beryllium, copper or brass, is used for the shielding case 91 to 94, it is useful not to complete a shorted turn about the coil stacks 11, 12 if accurate harmonic response (e.g. to 5 kHz and beyond) is desired.

Part of the reason for the sensor 10 being equivalent to an infinite solenoid is the choice of spacer thickness. In particular, the thickness of the first spacer 20 of the first coil stack 11 and the thickness of the first spacer 50 of the second coil stack 12 are chosen such that the sum of the thicknesses is equal to the thickness of the second to fifth spacers 21 to 25 and 51 to 55 of the first and second coil stacks 11, 12. The presence of the first magnetic bar 13 connecting the end face 43 of the first spacer 20 of the first coil stack 11 to the face 73 of the first spacer 50 of the second coil stack 12 has the effect that, magnetically, the distance between the first printed circuit board 27 of the first coil stack 11 and the first printed circuit board 57 of the second coil stack 12 is equal to the separation between adjacent printed circuit boards in either of the first and second coil stacks. As such, the second coil stack 12 appears, magnetically, as an extension of the first coil stack 11.

Because the sixth spacer 26 of the first coil stack 11 and the sixth spacer 56 of the second coil stack 12 are the same thickness and the thickness of each is equal to half of the thickness of the second to fifth spacers 21 to 25 and 51 to 55 of the first and second coil stacks 11, 12 and because the second magnetic bar 14 directly connects the end face 41 of the sixth spacer 26 of the first coil stack to the end face 71 of the sixth spacer 56 of the second coil stack 12, the same effect is experienced at the lowermost ends of the first and second coil stacks 11, 12. As such, the first coil stack 11 can be considered to be a continuation of the second coil stack 12 also at the other end. This contributes to the infinite solenoid effect.

In the above-described embodiments, each of the printed circuit boards 27 to 32 and 57 to 62 is substantially identical. As such, each of the printed circuit boards has the same number of coil turns and the same average turn radius. Also, the separation between adjacent printed circuit boards is the same for all of the circuit boards, which is the same as the effective separation between printed circuit boards that a separated by one of the first and second magnetic bars, 13, 14. This highly symmetrical arrangement has a number of advantages. One advantage is ease of manufacture. In particular, only one circuit board design is required and only two spacer designs are required. Another advantage is sensitivity, in that this highly regular arrangement has a uniform sensitivity to magnetic fields originating from within the volume defined by the sensor 10 whilst providing good rejection of externally applied magnetic fields. However, alternative arrangements will be envisaged by the skilled person. Many alternatives have almost as good performance, although may be of greater complexity and thus more expensive to manufacture.

The spacers 20 to 26 and 50 to 56 are made of a non magnetic material. For instance, the spacers 20 to 26 and 50 to 56 are made of a polycarbonate. The printed circuit boards 27 to 32 and 57 to 62 also are made of non-magnetic materials. The shielding cans 91 to 96 are also made of non magnetic materials. As such, the coil stacks 11, 12 are absent of magnetic material. The coil stacks 11, 12 constitute air gaps between the soft magnetic bars.

Dimensions of components of a prototype of the sensor 10 constructed by the inventors will now be provided for the purposes of illustration. In the prototype, the printed circuit boards are 0.4 mm thick, 10 mm wide and 25 mm long. The thickness of the second to fifth spacers is 3.95 mm, giving a separation between the centres of adjacent printed circuit boards (taking into account board thickness) of 4.35 mm. The overall length of each coil stack 11, 12, which defines the separation between the innermost surfaces of the soft magnetic bars, is 26 mm. The soft magnetic bars 13, 14 have dimensions of 27 mm deep by 60 mm long and 9 mm high.

When the coil stacks 11, 12 are in place, the separation between their longitudinal axes is 48 mm. Each printed circuit board is provided with 13 coil turns on each side. Considering that there are six double-sided printed circuit boards in each coil stack 11, 12, each coil stack has 156 turns, so there are 312 turns in total. The average area of each turn is 1.2 square centimeters (clearly different turns on a given side of a printed circuit board have different areas). The initial relative permeability of the soft magnetic bars is approximately 2000. Medium power ferrite with saturation at ~0.4 Tesla gives a current handling capability of approaching 1000 Arms for the sensor 10.

The sensor 10 is operable as a Rogowski-type sensor. The sensor 10 is able to be used to measure currents flowing through a conductor that passes into the volume between the first and second coil stacks 11, 12 and the first and second magnetic bars 13, 14, which is hereafter referred to as the sensing volume.

Sensitivity of the sensor within the sensing volume is determined by the area turns product per meter length of the coil stacks 11, 12. This is a generally applicable statement and does not apply only to the sensor 10

In the prototype sensor 10 referred-to above, the theoretical sensitivity is calculated as follows. The mutual inductance between the measured current and the sense coil is calculated as 6 (printed circuit boards in the coil stack)*26 (turns per printed circuit board)*(0.00012 (average area of the turns)/0.026 (coil stack length))*Uo (permeability of vacuum, $4\pi 10^{-7}$, or ~1.25e−6) is 0.9 μH. This represents 0.9 micro volt seconds per amp. Multiplying this by the angular frequency to get provides sensitivity in Volts/amp. For 50 Hz (mains frequency in many countries), the sensitivity is 0.28 mV/A.

However, actual sensitivity is reduced by two small factors, namely the finite permeability of the soft magnetic bars and due to the finite overlap of the soft magnetic bars beyond the coil stacks. It is envisaged by the inventors that sensitivity due to the finite permeability of the magnetic bars is reduced by between 0.1% and 1% and reduction in sensitivity due to the finite overlap of the magnetic bars beyond the coil stacks (assuming gaps formed by spacers at the end of the stacks) is between 0.05% and 0.5%. For example, in the sensor 10 as described, the finite permeability of the bars reduces the sensitivity by ~0.4%. As such, if the permeability doubles (e.g. due to increasing current and/or increasing temperature), the gain of the sensor will increase by 0.2%.

The limited projection of the flat surface of the soft magnetic bars 13, 14 beyond the outline of the coils gives a gain reduction of ~0.1%.

The gain reduction due to permeability can be altered by using a different permeability material for the soft magnetic bars 13, 14 and/or choosing a different thickness for the soft magnetic bars. For instance, the gain reduction due to permeability (0.4%) can be reduced by a factor of 5 to ~0.08% by increasing the ferrite permeability to 10,000 (e.g. by using Ferroxcube 3E6 material). The gain reduction can be halved again to 0.04% by doubling the thickness of the soft magnetic bars 13, 14 to ~16 mm.

The reduction in gain due to the limited projection of the soft magnetic bars 13, 14 can be reduced if desired by increasing the length and/or width of the magnetic bars. The reduction in gain can be reduced by a significant amount by increasing the length and width of the magnetic bars 13, 14 as described above by a few millimeters, although this is at the expense of increased overall size.

Generally, the sensor 10 is insensitive to uniform field (fields generated distant from the sensing volume are uniform at the sensor) provided that the sensor 10 is symmetrically built. Sensitivity to gradient field is limited by the limited permeability of the soft magnetic bars. For a given permeability, the shorter and thicker they are the better. Typical sensitivity of the sensor 10 to an external current carrying conductor immediately adjacent the exterior of the sensor is about ~1/500 compared to the conductor in the sensing volume. The sensitivity to such externally generated fields can be improved by approximately ten times by providing the magnetic bars with a permeability of 10000 and increasing the thickness of the magnetic bars to approximately 16 mm high. If ferrite is used as the soft material, increasing permeability tends to be balanced with lower maximum values of magnetic induction before saturation; the extra thickness of the magnetic bars 13, 14 provides extra capability whilst maintaining good current handling capability.

As mentioned above, sensitivity is given by turn area product per unit length. As such, the sensitivity can be increased by providing coils with greater areas, by providing more turns on the coils, by providing more layers of coils in each board, and/or by reducing the separation between adjacent printed circuit boards. Reducing the separation between adjacent boards requires smaller first spacers 20, 50, which can provide limitations when the sensor is provided in an openable housing, as is discussed below with reference to FIG. 2.

In the above description, each printed circuit board 27 to 32 and 57 to 62 is described as comprising one coil with turns on both sides of the board. Alternatively, the printed circuit boards 27 to 32 and 57 to 62 can be considered to comprise two coils, one on each side of the board. Here, each coil has 13 turns, although of course the total number of turns in the coil stack 11, 12 is unchanged.

In this case, the distance between the two coils on the board is equal to the thickness of the printed circuit board 27 to 32 and 57 to 62. Also, the distance from a coil to the next coil in the stack is equal to the thickness of the spacer that separates the adjacent printed circuit board. In this case, the coils in each coil stack 11, 12 are not equally spaced. Instead, the separation between coils alternates between the thickness of the spacer and the thickness of the printed circuit board along the length of the printed circuit board.

To allow the sensor 10 to be used to measure current flowing in a conductor, the conductor is passed in a direction through the plane of the page in FIG. 2b, or from left to right, or vice versa, in FIG. 2a. It will be appreciated that current flowing through such a conductor results in magnetic field lines forming concentric circles around the conductor, which lines of magnetic field therefore extend along the axis of each of the first and second coil stacks 11, 12. The magnetic bars 13, 14 serve to concentrate the magnetic field such as to focus the field through the first and second coil stacks 11, 12. It will be understood that Rogowski-type sensors conventionally do not include magnetic material.

There are a number of different options for providing the sensor 10 around a conductor. In a first option, the sensor 10 remains complete and the conductor is inserted into the hole formed by the first and second coil stacks 11, 12 and first and second magnetic bars 13, 14. With this method, however, the sensor 10 is not able to be retrofitted to a conductor that is in situ.

In a second option, once the magnetic bars 13, 14, for instance the first magnetic bar, 13, is separated from the ends 43, 73 of the first and second coil stacks 11, 12. Once the first magnetic bar 13 has been removed, the conductor can be inserted into the centre of the U shape formed by the first and second coil stacks 11, 12 and the second magnetic bar 14. The first magnetic bar 13 may then be reconnected to the faces 43, 73 of the first and second coil stacks 11, 12, and secured in place. The result of this is that the conductor is contained by the form main components 11 to 14 of the sensor 10, i.e. extends through the sensing volume.

Figure 6:
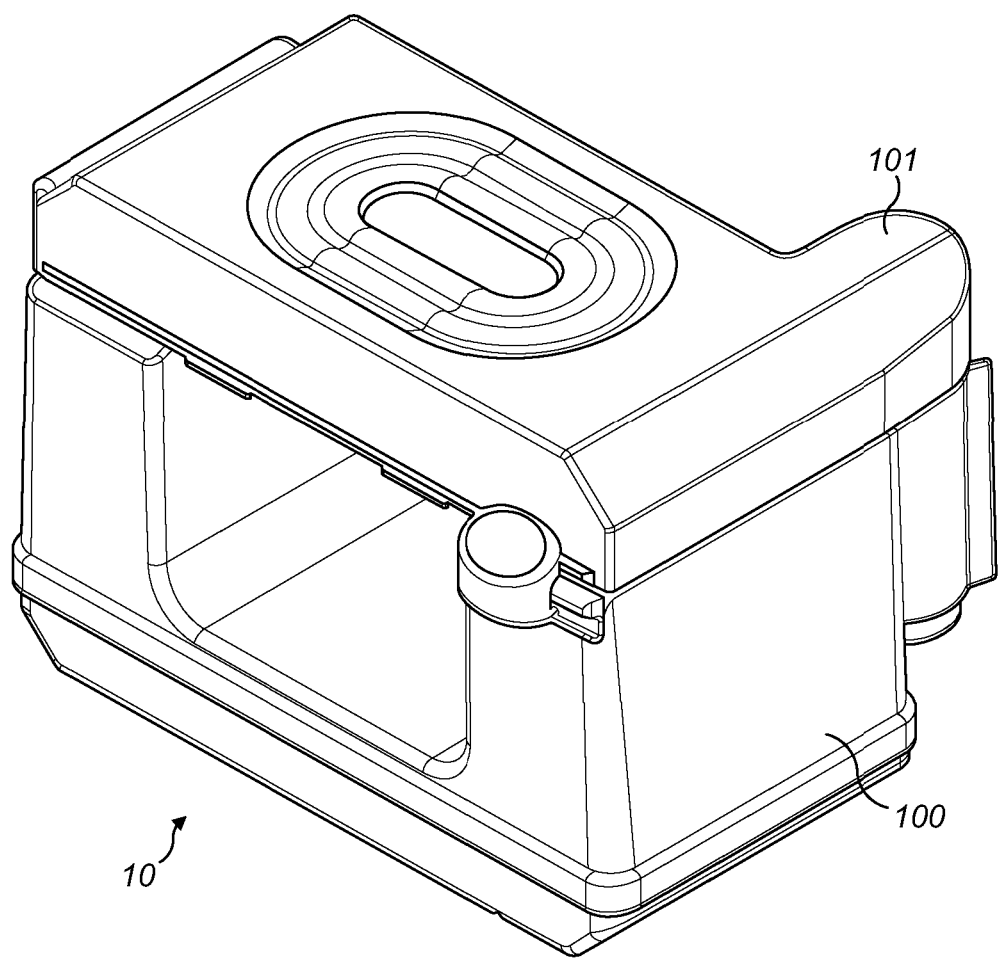
FIG. 6 is a perspective view of a second embodiment of a sensor according to the present invention in a closed position.
Figure 7A:
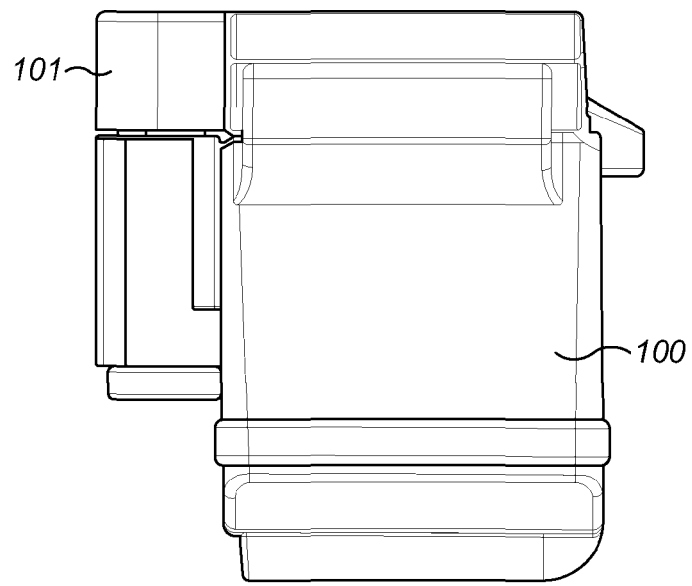
FIGS. 7a and 7b are side and end views of the second embodied sensor.
Figure 7B:
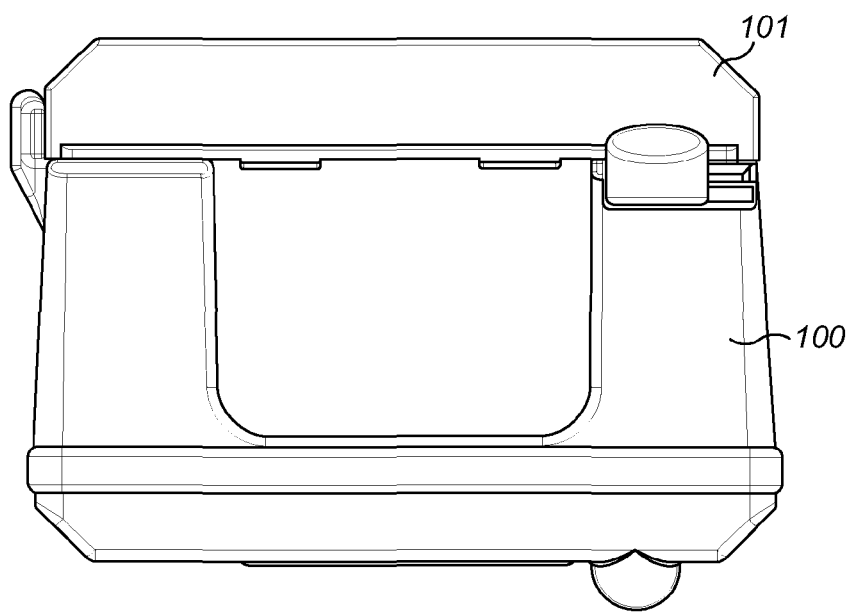
Figure 8:
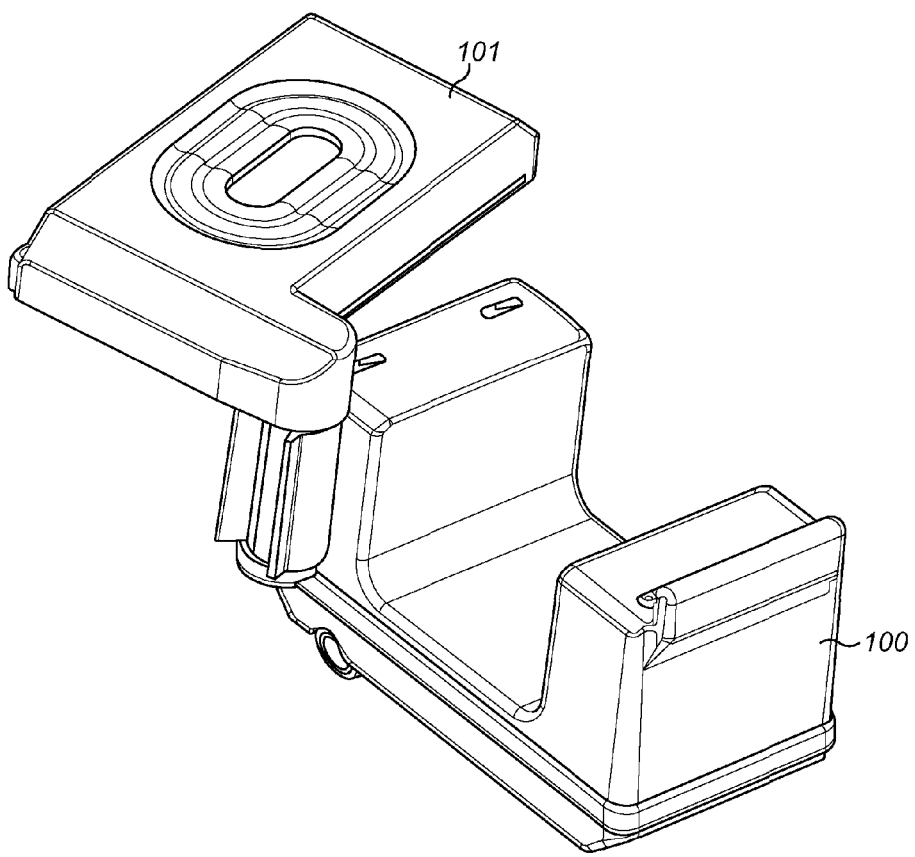
FIG. 8 is a perspective view of the second embodied sensor in an open position.

Alternatively, the sensor 10 may be provided in a housing that is constructed so as to allow the sensor 10 to be retrofitted to a conductor that is located in situ. A second embodiment of a sensor 10, which can be retrofitted particularly easily, is shown in FIGS. 6, 7 and 8, which will now be described. The sensor 10 includes all of the components of the first embodied sensor 10 except the first spacers 20, 50. The above description of the first embodied sensor should be considered to be present in this description of the second embodied sensor but is omitted here for conciseness and clarity.

The sensor 10 in this second embodiment comprises two main parts. A U-shaped part 100 is provided with a gate 101. In the U-shaped part 100, as shown in FIGS. 1 to 5, the circuit board 90 shown in FIG. 5 may also be present. Alternatively, some other means for connecting the turns of the coils on the circuit boards may be provided. The U-shaped part 100 may also include the shielding components 91 to 94 that are shown in FIG. 5.

The gate 101 is hinged at one end to one end of the U-shaped part 100. The other end of the gate 101 abuts the other end of the U-shaped part 100 but is not permanently secured thereto. The hinge connection between the U-shaped part 100 and the gate 101 allows the gate to be opened such as to allow a conductor to be inserted into the sensing volume, which is defined by the U-shaped part 100. Once the conductor is in place, the gate 101 may again be closed such that it abuts each to the two ends of the U-shaped part 100. The gate 101 includes the first magnetic bar 13, thereby acting as a magnetic field concentrator between the uppermost ends of the first and second coil stacks 11, 12.

The gate 101 and the U-shaped part 100 are configured so as to allow the sensor 10 to be semi-permanently fixed in the closed position. This may be achieved using a resilient clip, for instance. This allows the gate to be opened by a user when needed but causes the gate to remain closed otherwise, even if knocked or subjected to vibration.

It is shown in FIG. 8 that the hinge is such that the gate 101 pivots in the plane of the first magnetic bar 13. However, the gate 101 may instead pivot in some other way, for instance around an axis that extends perpendicular, rather than parallel to, an axis of the first and second coil stacks 11, 12.

In the embodiment shown in FIGS. 6 to 8, a gap between the first printed circuit boards 27, 57 of the first and second coil stacks 11, 12 and the magnetic bar 13 is provided by the thickness of the material of the U-shaped part 100 at the uppermost ends of the first and second coil stacks 11, 12 and the thickness of the material of the gate 101, that houses the first magnetic bar 13. The gate 101 and the U-shaped part 100 are configured such that the separation between the first printed circuit board 27 of the first coil stack 11 and the magnetic bar 17 and the separation between the first printed circuit board 57 of the second coil stack and bar 13 is equal, or approximately equal, to half the separation between adjacent printed circuit boards in the first coil stack 11. This may be achieved, for instance, by selecting the thickness of the material forming the parts of the U-shaped part and the gate 101 that lie between the magnetic bar and the ends of the coil stacks 11, 12 to correspond to the thicknesses of the spacers 20, 50 of FIGS. 1 to 5 and configuring the U-shaped part 100 and the gate 101 such that the two components are abutting when the sensor 10 is in the closed position shown in FIG. 6.

As mentioned above, the sensor 10 provides the equivalent of an infinite solenoid. Alternative arrangements also can provide the same affect, and some such alternatives will now be described with reference to FIGS. 9, 10 and 11.

Figure 9:
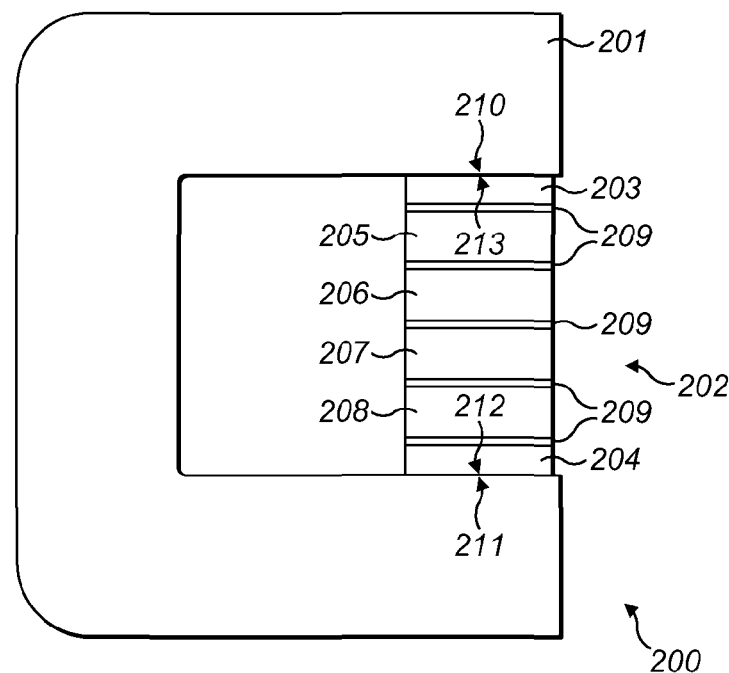
FIG. 9 is a side view of a sensor according to a third embodiment of the invention.

Referring firstly to FIG. 9, a third embodiment of a sensor 200 is shown. Here the sensor 200 comprises a U-shaped soft magnetic component 201 and a single coil stack 202. The coil stack 202 is very similar to the first and second coil stacks 11, 12 of the FIGS. 1 to 5 embodiments, and the above description of those coil stacks should be considered to be part of this description of the third embodiment, although is omitted here for clarity and conciseness. Very briefly, the coil stack 202 has a number of printed circuit boards 209 which are separated by spacers 205 to 208. The coil stack 202 is provided at its end with spacers 203 and 204 which are approximately half the thickness of the spacers 205 to 208 that are located between the printed circuit boards 209. The spacers 203 to 208 and the printed circuit boards 209 are aligned such that the first coil stack 202 has a generally rectangular cuboid shape. An uppermost end face 213 of the first spacer 203 is parallel to an end face 212 of the lowermost spacer 204.

An inside face 210 of one end of the U-shaped soft magnetic component 201 abuts the uppermost end face 213 of the coil stack 202. The inside face 211 of the other end of the U shape component 201 abuts the end face 212 at the bottom end of the coil stack 202. As such, the faces 210 and 211 of the soft magnetic component 201 are parallel to one another and are perpendicular to the longitudinal axis of the coil stack 202. Although not shown, the sensor 200 is three dimensional in that it extends into the direction of the page of the Figure.

As with the first embodiment, the soft magnetic component 201 serves to concentrate magnetic fields such as to cause one end of the coil stack 202 to link directly, magnetically, to the other end of the coil stack. Thus, the infinite solenoid effect is again provided.

A conductor (not shown) extending into the sensing volume defined by the U-shaped soft magnetic component 201 and the coil stack 202 is the subject of the sensor 200. A current flowing through the conductor generates a magnetic field around the conductor, which magnetic field extends generally longitudinally along the coil stack 202 and is concentrated through the U-shaped soft magnetic component 201. A changing current flowing in the conductor thus generates a corresponding emf in the coils of the coil stack 202, which can be used to measure the current flowing through the conductor.

To fit the sensor 200 to a conductor, either the conductor needs to be inserted into the volume between the U-shaped soft magnetic component 201 and the coil stack 202 or the coil stack 202 needs to be removed before the U-shaped component 201 is placed over the conductor and the coil stack 202 then reintroduced into the volume between the ends of the U-shaped soft magnetic component 201. These two methods assume that the U-shaped component 201 is a unitary piece that is relatively rigid. Alternatively, the U-shaped soft magnetic component 201 may not be rigid and may in some way allow the introduction of a conductor into the sensing volume. A housing (not shown) may be provided to facilitate this.

A fourth embodiment will now be described with reference to FIG. 10. Here, first to fourth coil stacks 301 to 304 are arranged in a rectangle, in particular a square. Each of the coil stacks is as described above in relation to the first or third embodiments. As such, each of the coil stacks 301 to 304 has ends that are generally parallel to one another. First to fourth soft magnetic parts 305 to 308 are provided. The soft magnetic parts 305 to 308 each connect the ends of two adjacent coil stacks. Faces of the soft magnetic parts 305 to 308 that contact an end of a coil stack 301 to 304 are flat and are arranged generally perpendicular to the longitudinal axis of the respective coil stack. As such, each soft magnetic component 305 to 308 includes two faces that are generally perpendicular to one another so as to result in adjacent coil stacks 301 to 304 being supported at a 90° angle to each another.

Figure 10:
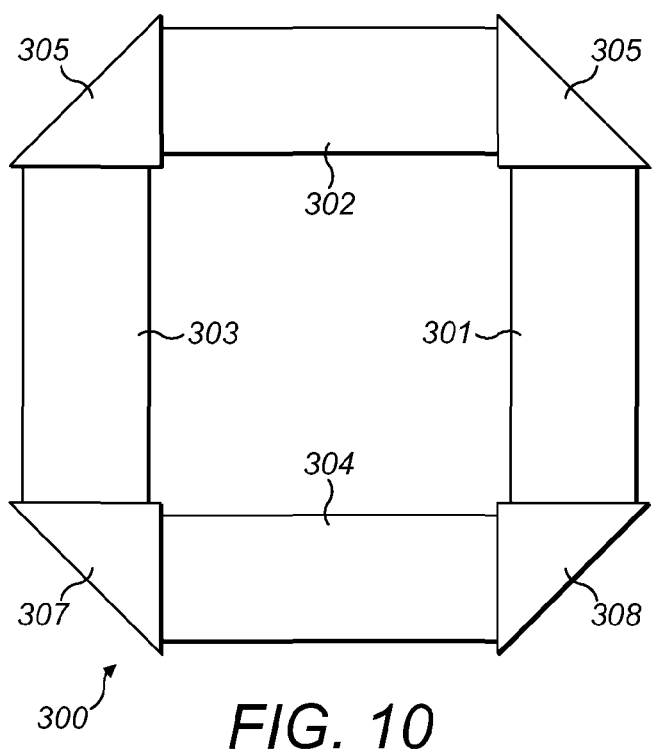
FIG. 10 is a side view of a sensor according to a fourth embodiment of the invention.

In FIG. 10, the soft magnetic components 305 to 308 are shown as having generally triangular cross sections. However, alternative shapes are conceived. For instance, the soft magnetic parts 305 to 308 may have a square cross section or they may have a cross section of a quarter of a circle. A main requirement is that faces of the soft magnetic components 305 to 308 are flat and extend perpendicular to the relevant axis of the coil stacks 301 to 304. Although not shown, the sensor 300 is three dimensional in that it extends into the direction of the page of the Figure.

The fourth embodied sensor 300 also provides the effect of an infinite solenoid. The sensor is capable of allowing measurement of a current flowing through a conductor provides in the sensing volume that is defined between the coil stacks 301 to 304.

The above-described sensors 10, 200, 300 provide sensing volumes that are generally rectangular in cross-section. The sensors 10, 200, 300 can be used to measure currents flowing in any conductor that can be accommodated in the sensing volumes.

In some embodiments, the sensors 10, 200, 300 are installed around conductors of electricity substations, particularly low-voltage or distribution substations. Here, the conductors at the inputs of the substation tend to be circular or a circular segment in cross-section and have a diameter, including the insulation sheath, of tens of millimeters. Using a sensor 10, 200, 300 having a minimum internal dimension only slightly larger than the external diameter of the conductor, the overall size of the sensor installed onto the conductor can be relatively small. The sensors 10, 200, 300 thus can be installed even where plural conductors are relatively tightly packed, as is increasingly common in modern substations. Moreover, this is achieved even though the sensors provide relatively good performance in terms of accuracy and sensitivity. A contributory factor in the compactness of the sensors is the provision of the longest side of the printed circuit boards in the direction along the axis of the sensing volume. This allows the shortest side to be radial to the axis of the sensing volume, thereby minimising the additional diameter added to the conductor when the sensor is installed thereon.

When the sensor is provided within an openable housing, such as is shown in FIGS. 6, 7 and 8, a separation between a printed circuit board at the end of a coil stack that is included in the main body 100 and the magnetic bar 13, 14 that is included in the gate 101 of the housing is dependent on mechanical features that provide insulation and/or weatherproofing to the housing. In general, greater sensitivity is provided by a greater number of turns per unit length of the coil stack. The minimum separation that can be achieved between the end printed circuit board and the magnetic bar 13, 14 also defines the separation between adjacent boards in the coil stack. For a given length coil stack, this defines the number of boards that are present in the stack.

Figure 11:
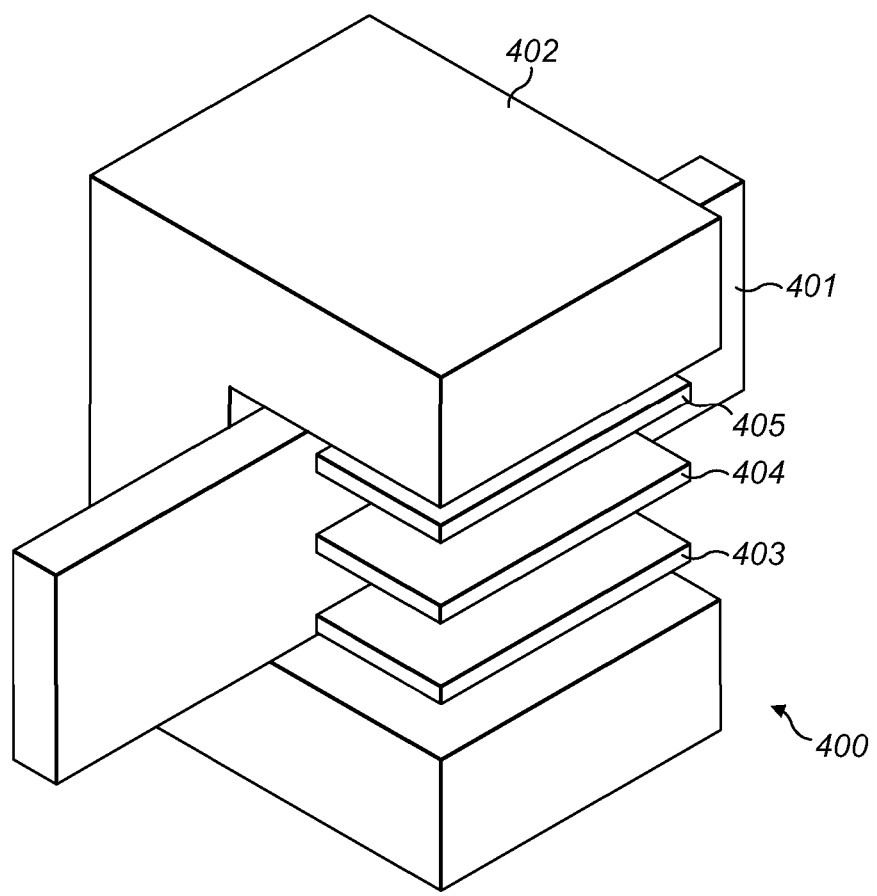
FIG. 11 is a side view of a sensor according to a fifth embodiment of the invention.

A sensor 400 constructed according to a fifth embodiment is shown in FIG. 11.

The sensor is similar to the third embodied sensor 200 in that it includes a U-shaped soft magnetic component 402 and a coil stack. The coil stack includes three printed circuit boards 403 to 405. The printed circuit boards 403 to 405 are regularly spaced.

Other features from the first and second embodiments are included in the sensor 400 but are omitted from the Figure and this description for clarity and conciseness.

Also shown in FIG. 11 is a conductor 401, in the form of a busbar. The busbar 401 extends through the sensing volume that is defined between the three sides of the U-shaped soft magnetic component 402 and the coil stack. It will be seen also that there is relatively little separation between the busbar 401 and the nearest surfaces of the sensor 400. This allows the overall volume of the sensor to be relatively small, and indeed smaller than many prior art sensors used for similar purposes. The sensor 400 certainly is smaller than prior art sensors that may have similar ease of manufacture and/or similar performance.

The sensor 400 may be provided with a housing (not shown) with which to insulate the sensor 400 from the busbar 401. However, if the materials of the relevant parts of the sensor 400 are chosen carefully, the parts of the sensor 400 that can contact the busbar 401 may be sufficiently electrically insulating that no additional housing or other insulation is required. Additionally, if the relative positions of the sensor 400 and the busbar 401 can be correctly maintained, as for instance can be provided in embodiments in which the sensor 400 in incorporated in a switchboard, electricity substation, distribution board or meter, no precautions need be made to provide electrical insulation between the sensor and the busbar 401.

In other embodiments, the coil stacks 11, 12 can also be made as a single part using multilayer printed circuit board technology. The multilayer printed circuit board may or may nor include spacers provided by layers of the board at the ends of the coil stacks 11, 12. In a multilayer printed circuit board, each layer comprises a substrate.

Figure 12A:
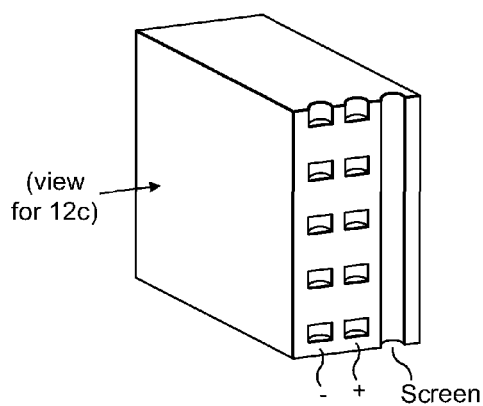
FIGS. 12a, 12b and 12c show a double-sided printed circuit board that provides a coil stack that is used in some embodiments of the invention.
Figure 12B:
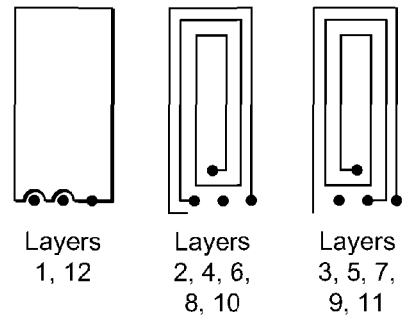
Figure 12C:
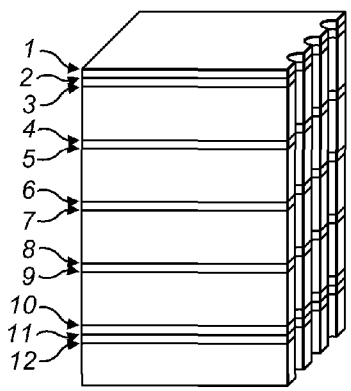

One such coil stack is illustrated in FIG. 12. FIG. 12a shows the single part stack, FIG. 12b shows the layout of printed circuit board layers, and FIG. 12C shows a side perspective view that illustrates placement of the layers within the height of the printed circuit board.

In this example, twelve printed circuit board layers are provided. These include a screen layer at the top and another screen layer at the bottom. A screening track extends around the outside of each of layers 2 to 11.

Each pair of the non-screening layers 2,3; 4,5; 6,7; 8,9; 10,11 forms a coil with connections to the exterior surface of the printed circuit board, as shown on the right of FIG. 12a. In this embodiment, these are connected in the same way as the boards in the stack in the sensor 10 as described above, but in other embodiments they are interconnected together in series within the multilayer printed circuit board.

Figure 13:
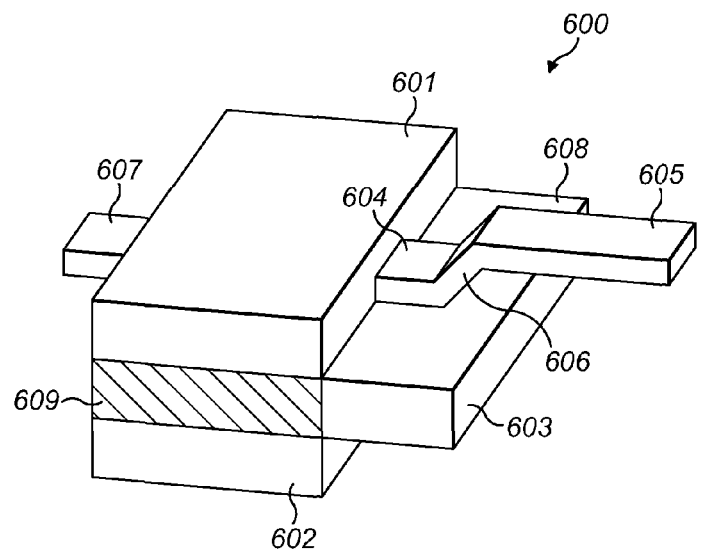
FIG. 13 is a perspective view of a sensor according to a sixth embodiment.

Two coil stacks may alternatively be provided from a single printed circuit board, as will now be described with reference to FIG. 13. Here, a sensor 600 comprises first and second magnetic bars 601, 602 that are separated by a multilayer printed circuit board 603. The printed circuit board 603 includes a slot or cutaway 604 into which a conductor 605 is located. The slot 604 extends between a front and back of the sensor 600. A bend 605 in the conductor 605 allows the conductor 605 to depart from the plane of the printed circuit board 603, although a part 607 of the conductor extends along the plane of the printed circuit board 603. Coil stacks 608, 609 are formed within the printed circuit board 603 either side of the slot 604 and between the magnetic bars 601, 602. The coil stacks are connected together by the part of the printed circuit board that extends around the end of the slot 604.

Figure 14A:
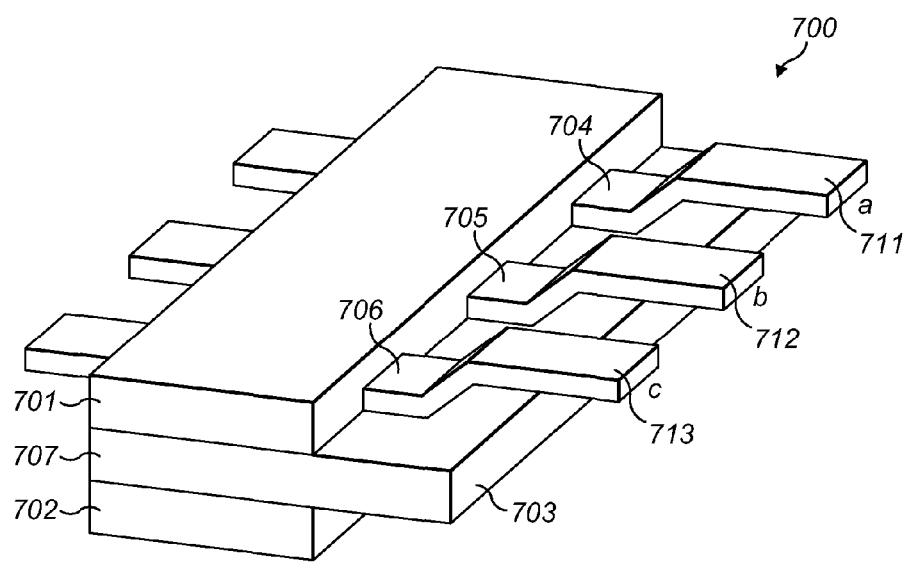
FIGS. 14a to 14d represent different aspects of a sensor according to a seventh embodiment of the invention.

This can be extended to make a multiphase transducer, as will now be described with reference to FIG. 14. In FIG. 14a, four coil stacks are provided from a single printed circuit board. A sensor 700 comprises first and second magnetic bars 701, 702 that are separated by a multilayer printed circuit board 703. The printed circuit board 703 includes three slots or cutaway portions 704 to 706 into each of which a respective conductor 711 to 713 is located. Each slot 704 to 706 extends between a front and back of the sensor 700. A bend in each conductor 704 to 706 allows it to depart from the plane of the printed circuit board 703, although a part of each conductor extends along the plane of the printed circuit board 703. Four coil stacks 707 to 710 are formed within the printed circuit board 703. Each pair of coil stacks 707 to 710 is formed either side of a slot 704 to 706 and between the magnetic bars 701, 702. The coil stacks 707 to 710 are connected together by the part of the printed circuit board that extends around the end of the slots 704 to 706.

Figure 14B:
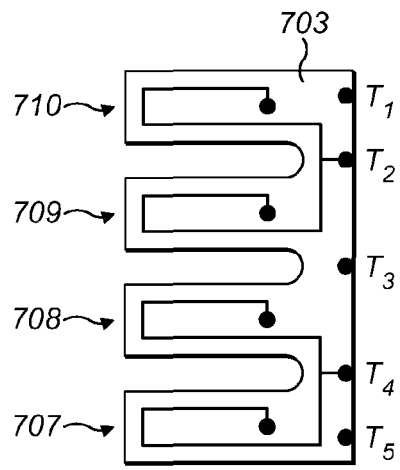
Figure 14C:
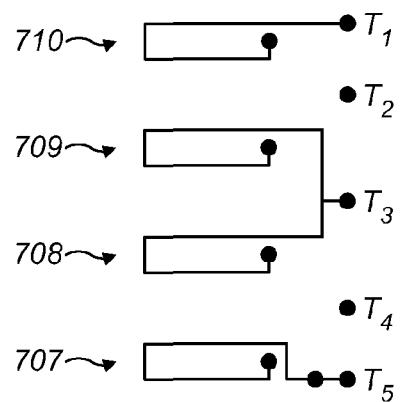

FIGS. 14a and 14b show patterns on opposite sides of one layer within the printed circuit board 703. Here, it can be seen that the coil stacks 707 to 710 include turns on each side of the board layer that are connected by a respective through-layer via. These figures also show how the patterns are connected to terminals T1 to T5. These can for instance be connected to the differential current inputs on a polyphase metering chip.

An alternative coil pattern includes an individual pair of coils on either side of each conductor 711, 712, 713. This provides independent isolated outputs, although at the expense of a larger overall sensor, a greater number of layers in the printed circuit board or lower sensitivity.

Figure 14D:
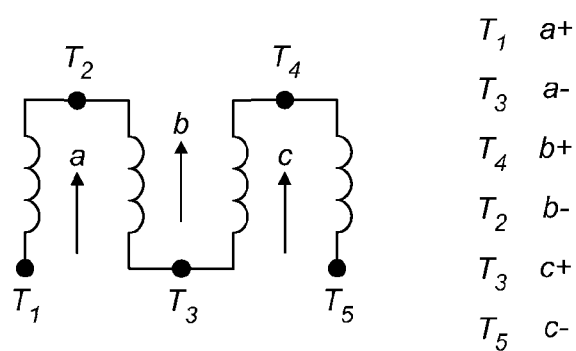

FIG. 14d illustrates an circuit formed by the printed circuit board 703 and shows terminals T1 to T5 that provide signals from the coil stacks 707 to 710.

FIG. 14 shows how a three phase current may be measured using a small number of coil stacks, in this case equal to the number of conductors plus one. This is possible because of the coil stack sharing that results from the relative locations of the conductors and the coil stacks.

In other embodiments, the same effect is achieved using independent coil stacks, i.e. coil stacks that are not formed within a common printed circuit board.

All of the above-described sensors 10, 200, 300, 400, 600, 700 have the advantage of being relatively simple to manufacture reliably with the desired properties, and at relatively low cost. This is an effect in particular of the printing of the turns of the coils and the locating of the substrates supporting the coils in relation to one another and to the soft magnetic material. Moreover, the sensors also are susceptible to retrofitting onto existing conductors whilst maintaining their original form or configuration, and thus maintaining their desirable properties, except for where otherwise stated.

Some general comments about the different configurations will now be provided.

The greater the number of coil stacks in a sensor, the greater is the symmetry of the sensor, and the lower is the effect of limited permeability of the soft magnetic components. However, this is achieved at the expense of higher complexity of the sensor assembly.

For a lowest negative effect from limited permeability, the sensors of the first, second and fourth embodiments, i.e. those embodiments not using U-shaped soft magnetic components, are preferred. However, a U-shaped soft magnetic component provides a dipole moment, which is sensitive to uniform fields. When using U-shaped soft components in multiple sets of sensors measuring polyphase current or a pair of +/− phases for power monitoring or fiscal measurement (metering) purposes, it is preferred to have all the U shapes facing the same direction, or less preferably generally the same direction, so that the common sensitivity to uniform field cancels out when multiplied by the out of phase voltages in the power calculation. A dual coil stack sensor, such as the sensor 10 of the first and second embodiments, provides a quadrupole moment, which has sensitivity to first order gradient fields. A quad coil stack sensor in a square, such as the fourth embodied sensor 300, is sensitive only to higher order field gradients.

Alterative arrangements will be envisaged by the skilled person.

For instance, the printed circuit boards may be made of FR4 or some other suitable material, such as alumina or a paper-based material. Each of these materials allows the construction of double-sided boards incorporating vias. Other embodiments utilise single-sided boards. Because the printed circuit boards are relatively small and have a relatively simple shape, it can be advantageous for the boards to be made of a material that can be stamped. Some types of FR4 are suitable for stamping, as are paper-based boards. Alumina boards can be laser cut.

In some embodiments the spacers are omitted from the coil stacks. In the embodiments above the spacers serve a purpose of maintaining the printed circuit boards, and thus the coils, in the desired position. However, this may be achieved instead in some other manner, for instance using a frame or housing that is mechanically coupled to the printed circuit boards so as to fix them in position.

Additionally, in some embodiments there are different numbers of coils on different printed circuit boards. Alternatively or in addition there may be irregular spacing between adjacent printed circuit boards. Such embodiments may be satisfactory in many applications, although regular sensors have the best performance. Varying the turns area product on boards can be used to compensate to some extent for variations in spacing between printed circuit boards and magnetic bars 13, 14 that may be unavoidable in sensor design, for instance because of a minimum that can be achieved between components when using a body and openable gate-type housing.

In some embodiments, each coil stack in a sensor includes only one single layer, double-sided circuit board, each circuit board having a coil printed on each side thereof. As such, the circuit board provides two coils. The sensor may include one or two such coil stacks, or in other embodiments more coil stacks. Placement of the printed circuit board in the sensor is chosen so as to achieve a suitable separation between adjacent coils. For instance, in a dual core stack sensor the printed circuit boards may be located centrally between two magnetic bars such as the bars 13, 14 of FIG. 1.

It will be appreciated that the above-described embodiments are purely illustrative and not limiting on the scope of protection, which is defined only by the appended claims and their equivalents.

The invention claimed is:

1. A current sensor, comprising:
one or more coil stacks; and
one or more soft magnetic elements each comprising soft magnetic material,
wherein the one or more coil stacks and the one or more soft magnetic elements are connected together to form a closed loop that encompasses a sensing volume;
wherein at least one of the one or more coil stacks comprises a first coil stack comprising plural coils lying on a longitudinal axis of the first coil stack, wherein:
each coil comprises one or more turns printed on at least one planar surface of a respective substrate, and
the planes of the coils are parallel to one another and are perpendicular to the longitudinal axis of the first coil stack;
wherein a first one of the one or more soft magnetic elements has a first planar face of the first coil stack and arranged perpendicularly to and intersected by the longitudinal axis of the first coil stack; and
wherein said first one of the one or more soft magnetic elements or another one of the soft magnetic elements has a second planar face located at a second end of the first coil stack and arranged perpendicularly to and intersected by the longitudinal axis of the first coil stack.

2. A sensor as claimed in claim 1, wherein a separation between adjacent coils is approximately the same for all coils of the first coil stack.

3. A sensor as claimed in claim 1, wherein the coils of the first coil stack each include the same number of turns and have the same area on the substrate.

4. A sensor as claimed in claim 1, wherein the first one of the one or more soft magnetic elements is the only soft magnetic elements and comprises a U-shaped soft magnetic component and wherein the first and second faces are parallel faces within a mouth of the U.

5. A sensor as claimed in claim 4, wherein the first one of the one or more soft magnetic elements is separable from the first coil stack so as to allow a conductor to be introduced into the U before the first coil stack is placed within the mouth of the U of the first one of the one or more soft magnetic elements.

6. A sensor as claimed in claim 4, wherein a separation between adjacent coils is approximately the same for all coils of the first coil stack and wherein a separation between a coil closest to the first end and the first contact face is substantially equal to a separation between a coil closest to the second end and the second contact face and is equal or approximately equal to half of the separation between adjacent coils.

7. A sensor as claimed in claim 6, wherein the first one of the one or more soft magnetic elements is separable from the first coil stack so as to allow a conductor to be introduced into the U before the first coil stack is placed within the mouth of the U of the first one of the one or more soft magnetic elements and wherein the sensor comprises means for causing the first coil stack to be maintained within the mouth of the U of the first one of the one or more soft magnetic elements.

8. A sensor as claimed in claim 1, comprising a second coil stack comprising plural coils lying on a longitudinal axis of the first coil stack, wherein: each coil of the second coil stack comprises one or more turns printed on at least one planar surface of a respective substrate, and the coils of the second coil stack are parallel to one another and lie on a longitudinal axis of the second coil stack; wherein the first one of the one or more soft magnetic elements comprises a third planar face arranged perpendicularly to and intersected by the longitudinal axis of the second coil stack and wherein a second one of the one or more soft magnetic elements comprises a fourth planar face arranged perpendicularly to and intersected by the longitudinal axis of the second coil stack.

9. A sensor as claimed in claim 8, wherein the first and second ones of the one or more soft magnetic elements comprises first and second I-shaped components, the first I-shaped component including the first and third planar faces and the second I-shaped component including the second and fourth planar faces.

10. A sensor as claimed in claim 9, wherein a separation between adjacent coils is approximately the same for all coils of the first and second coil stacks and wherein a separation between a coil closest to the first end of the first coil stack and the first face is the same as a separation between a coil closest to the second end of the first coil stack and the second face, which is the same a separation between a coil closest to the first end of the second coil stacks and the third face and is the same as a separation between a coil closest to the second end of the second coil stack and the fourth face, and is approximately half the separation between adjacent coils.

11. A sensor as claimed in claim 8, wherein the second component comprises one or more further each including plural coils, wherein: each coil of each further one or more turns printed on at least one planar surface of a respective substrate, and the coils of each further parallel to one another and lying on a longitudinal axis of the further.

12. A sensor as claimed in claim 8, wherein the first and are formed of a single multilayer printed circuit board having formed therein a slot or cutaway configured to receive a conductor.

13. A sensor as claimed in claim 1, wherein adjacent substrates are mechanically separated by spacers, and/or wherein an end substrate in the first coil stack is separated from the first coil stack by a spacer.

14. A sensor as claimed claim 1, comprising a circuit board configured to connect the coils in a circuit.

15. A sensor as claimed claim 1, comprising one or more shielding components configured to at least partially surround the first coil stack and, if present, the third coil stack.

16. A sensor as claimed claim 1, comprising a current-carrying conductor extending through the sensing volume of the sensor.

17. A sensor as claimed claim 1, wherein the soft magnetic material is a ferrite.

18. A sensor as claimed in claim 1, wherein each coil comprises one or more turns printed on at least two parallel surfaces of a respective substrate.

19. A sensor as claimed in claim 1, wherein the first coil stack comprises first and second coils printed respectively on first and second parallel surfaces of a first substrate.

20. A current sensor, comprising:
first and second coil stacks; and
first and second soft magnetic elements each comprising soft magnetic material,
wherein the first and second coil stacks and the first and second soft magnetic elements are connected together to form a closed loop that encompasses a sensing volume;
wherein each of the first and second coil stacks comprises plural coils lying on a longitudinal axis of the respective coil stack, wherein:
each coil comprises one or more turns printed on at least one planar surface of a respective substrate, and
the planes of the coils are parallel to one another and are perpendicular to the longitudinal axis of the respective coil stack;
wherein the first soft magnetic element has:
a first planar face located at a first end of the first coil stack and arranged perpendicularly to and intersected by the longitudinal axis of the first coil stack, and
a third planar face arranged perpendicularly to and intersected by the longitudinal axis of the second coil stack, and
wherein the second magnetic element has:
a second planar face located at a second end of the first coil stack and arranged perpendicularly to and intersected by the longitudinal axis of the first coil stack, and
a fourth planar face arranged perpendicularly to and intersected by the longitudinal axis of the second coil stack.

* * * * *